(12) United States Patent
Huang et al.

(10) Patent No.: US 8,853,733 B2
(45) Date of Patent: Oct. 7, 2014

(54) LIGHT EMITTING DIODE PACKAGE AND METHOD FOR MANUFACTURING THE SAME

(71) Applicant: Advanced Optoelectronic Technology, Inc., Hsinchu Hsien (TW)

(72) Inventors: Che-Hsang Huang, Hsinchu (TW); Pin-Chuan Chen, Hsinchu (TW); Lung-Hsin Chen, Hsinchu (TW); Wen-Liang Tseng, Hsinchu (TW); Yu-Liang Huang, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 0 days.

(21) Appl. No.: 13/965,185

(22) Filed: Aug. 12, 2013

(65) Prior Publication Data

US 2014/0084312 A1 Mar. 27, 2014

(30) Foreign Application Priority Data

Sep. 21, 2012 (CN) .......................... 2012 1 3538055

(51) Int. Cl.
| | |
|---|---|
| H01L 33/00 | (2010.01) |
| H01L 25/075 | (2006.01) |
| H01L 23/00 | (2006.01) |
| H01L 27/15 | (2006.01) |
| H01L 33/62 | (2010.01) |

(52) U.S. Cl.
CPC ....... *H01L 27/15* (2013.01); *H01L 2224/48247* (2013.01); *H01L 33/62* (2013.01); *H01L 2224/48257* (2013.01); *H01L 25/0753* (2013.01); *H01L 24/97* (2013.01); *H01L 2224/48091* (2013.01)

USPC .......... 257/99; 257/79; 257/88; 257/E33.057; 257/E33.066; 438/26; 438/28

(58) Field of Classification Search
USPC ........ 257/79, 88, 99, 100, E33.056, E33.057, 257/E33.058, E33.059, E33.066; 438/22, 438/26, 28
See application file for complete search history.

(56) References Cited

U.S. PATENT DOCUMENTS

| | | | |
|---|---|---|---|
| 2010/0001306 A1* | 1/2010 | Park et al. ........................ | 257/99 |
| 2011/0186901 A1* | 8/2011 | Ushiyama et al. .............. | 257/99 |
| 2011/0309404 A1* | 12/2011 | Lee ................................. | 257/99 |
| 2012/0262941 A1* | 10/2012 | Min .............................. | 362/607 |

* cited by examiner

*Primary Examiner* — Eduardo A Rodela
(74) *Attorney, Agent, or Firm* — Novak Druce Connolly Bove + Quigg LLP (57) ABSTRACT

An light-emitting diode (LED) package includes a substrate, a electrode structure embedded in the substrate, and a plurality of LED chips electrically connecting with the electrode structure. The substrate includes a main portion and a protruding portion extending from a bottom surface of the main portion. The main portion is located above the protruding portion. The electrode structure includes a first, a second and a third electrode spaced from each other. The third electrode is located between the first and second electrodes. Top surfaces of the first, second and third electrodes are exposed out of the top surface of the main portion. Bottom surfaces of the first and second electrodes are exposed out of the bottom surface of the main portion. Bottom surface of the third electrode is covered by the protruding portion. The present disclosure also relates to a method for manufacturing the LED package.

15 Claims, 11 Drawing Sheets

LIGHT EMITTING DIODE PACKAGE AND METHOD FOR MANUFACTURING THE SAME

BACKGROUND

1. Technical Field

The present disclosure generally relates to solid state light emitting sources and, more particularly, to a light emitting diode (LED) package and a method for manufacturing the LED package.

2. Description of Related Art

LEDs have many advantages, such as high luminosity, low operational voltage, low power consumption, compatibility with integrated circuits, easy driving, long term reliability, and environmental friendliness which have promoted the wide use of LEDs as a light source.

A conventional LED package includes a substrate, a plurality of electrodes arranged on the substrate, a plurality of LED chips mounted on the electrodes and electrically connecting the electrodes respectively. When the LED package is mounted to a printed circuit board, every electrode of the LED package is exposed to electrically connect a corresponding welding pad on the printed circuit board. However, because a distance between two adjacent electrodes is very close, such that, welding solder on the welding pads of the printed circuit board can easily overflow to contaminate each other during the SMT (surface mounting technology) process, thereby resulting in a short circuit of the LED package.

Therefore, what is needed, is an LED package and a method for manufacturing the LED package which can overcome the limitations described above.

DETAILED DESCRIPTION

Embodiments of an LED package and a method for manufacturing the LED package of the present disclosure will now be described in detail below and with reference to the drawings.

Figure 1:
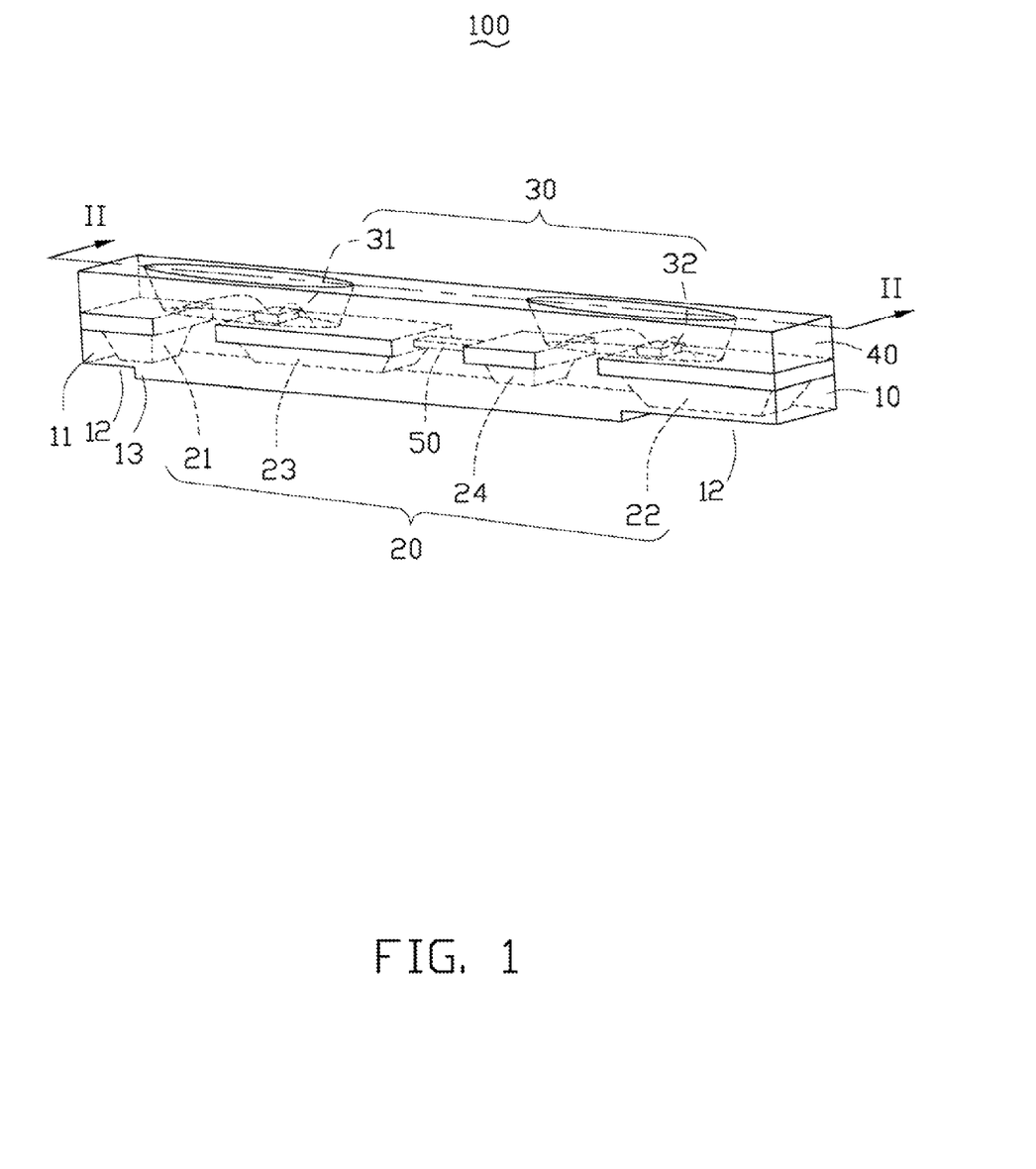
FIG. 1 is a perspective view of an LED package in accordance with a first exemplary embodiment of the present disclosure.
Figure 2:
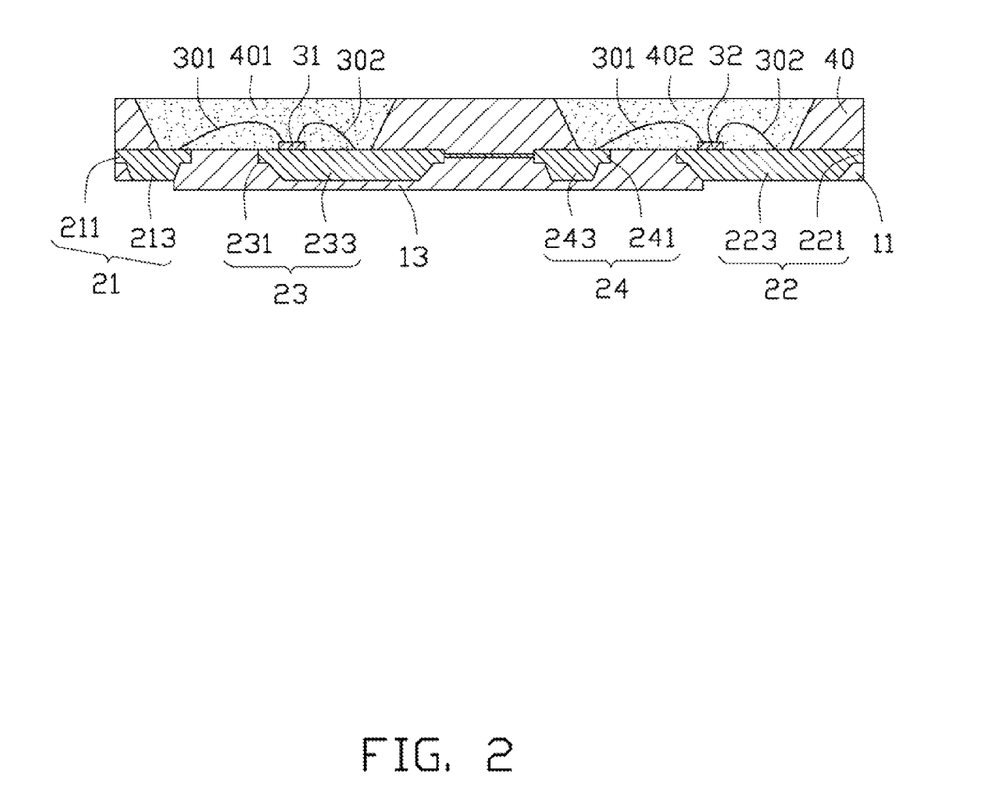
FIG. 2 is a cross-sectional view of the LED package of FIG. 1, taken along line II-II thereof.

Referring to FIGS. 1 and 2, an LED package 100 in accordance with an exemplary embodiment is provided. The LED package 100 includes a substrate 10, an electrode structure 20 embedded in the substrate 10, a plurality of LED chips 30 electrically connecting the electrode structure 20, and a reflector 40 located on the substrate 10 and covering the electrode structure 20 and surrounding the LED chips 30.

The substrate 10 is made of electrically-insulating material, such as epoxy resin. The substrate 10 includes a main portion 11 and a protruding portion 13 downwardly extending from a bottom surface of the main portion 11. The main portion 11 and the protruding portion 13 are rectangular parallelepiped wherein the protruding portion 13 is smaller than the main portion 11, such that a front side view of the substrate 10 represents approximately "T" shape. The main portion 11 is located above the protruding portion 13, such that two receiving spaces 12 are defined by the bottom surface of the main portion 11 and the opposite lateral end faces of the protruding portion 13 respectively. The protruding portion 13 is thinner than the main portion 11. In this embodiment, the protruding portion 13 is integrally formed with the main portion 11 as a single piece.

The electrode structure 20 includes a first electrode 21, a second electrode 22, a third electrode 23 and a fourth electrode 24. The first electrode 21, the second electrode 22, the third electrode 23, and the fourth electrode 24 are spaced from each other, and are arranged along a longitudinal direction of the LED package 100.

The first electrode 21 and the second electrode 22 are embedded in the main portion 11 of the substrate 10, and located at opposite ends of the main portion 11 respectively.

Top surfaces of the first and second electrodes 21, 22 are exposed out of the top surface of the main portion 11 to support the LED chips 30. In this embodiment, the top surfaces of the first and second electrodes 21, 22 are coplanar with the top surface of the main portion 11.

Bottom surfaces of the first and second electrodes 21, 22 are exposed to an outside through the bottom surface of the main portion 11 to connect welding pads on a printed circuit board (not shown). In this embodiment, the bottom surfaces of the first and second electrodes 21, 22 are coplanar with the bottom surface of the main portion 11.

The third electrode 23 and the fourth electrode 24 are embedded in the main portion 11, and are successively located between the first and second electrodes 21, 22.

Top surfaces of the first and second electrodes 23, 24 are exposed out of the top surface of the main portion 11 to support the LED chips 30. In this embodiment, the top surfaces of the first and second electrodes 23, 24 are coplanar with the top surface of the main portion 11.

Bottom surfaces of the first and second electrodes 23, 24 are covered by the protruding portion 13. In this embodiment, the third electrode 23 connects the fourth electrode 24 via a connecting bar 50. The connecting bar 50 is embedded in the main portion 11, and is located between the third electrode 23 and the fourth electrode 24 along the longitudinal direction of the substrate 10. In this embodiment, the connecting bar 50 is made of copper.

The first electrode 21 includes a first main portion 211 and a first supporting portion 213 extending downwardly from a central portion of a bottom surface of the first main portion 211, such that a cross-sectional view of the first electrode 21 has an approximately T-shaped configuration.

The first main portion 211 is a rectangular board. The first supporting portion 213 has a configuration like an inverted quadrangular frustum, and a size of the first supporting portion 213 is gradually decreased from a top end connecting the bottom surface of the first main portion 211 to the bottom end thereof which is away from first main portion 211. A top surface of the first main portion 211 is the top surface of the first electrode 21. A bottom surface of the first supporting portion 213 is the bottom surface of the first electrode 21.

The second electrode 22 has a structure similar to the structure of the first electrode 21, and the second electrode 22 includes a second main portion 221 and a second supporting portion 223. The top surface of the second main portion 221 is the top surface of the second electrode 22, and the bottom surface of the supporting portion 223 is the bottom surface of the second electrode 22.

Similarly, the third electrode 23 includes a third main portion 231 and a third supporting portion 233; and the fourth electrode 24 includes a fourth main portion 241 and a fourth supporting portion 243. The top surfaces of the third and the fourth main portions 231, 241 are the top surfaces of the third and fourth electrodes 23, 24 respectively, and the bottom surfaces of the third and fourth supporting portion 233, 243 are the bottom surfaces of the third and fourth electrodes 23, 24.

The LED chips 30 include a first LED chip 31 and a second LED chip 32. In this embodiment, the first LED chip 31 is located on the top surface of the third main portion 231, and electrically connects the first and third electrodes 21, 23 respectively via wires 301, 302. The second LED chip 32 is located on the top surface of the second main portion 221, and electrically connects with the fourth and second electrodes 24, 22 respectively via wires 301, 302.

The first LED chip 31 and the second LED chip 32 can radiate light with different colors. Alternatively, the first LED chip 31 can be mounted on the top surface of the first electrode 21, the second LED chip 32 can be mounted on the top surface of the third electrode 23; and the first and second LED chips 31, 32 can radiate light with the same color.

The reflector 40 defines a first through hole 401 and a second through hole 402 therein. The first LED chip 31 is located at the bottom end of the first through hole 401. The second LED chip 32 is located at the bottom end of the second through hole 402. The first LED chip 31 and the second LED chip 32 are surrounded by the reflector 40.

Figure 3:
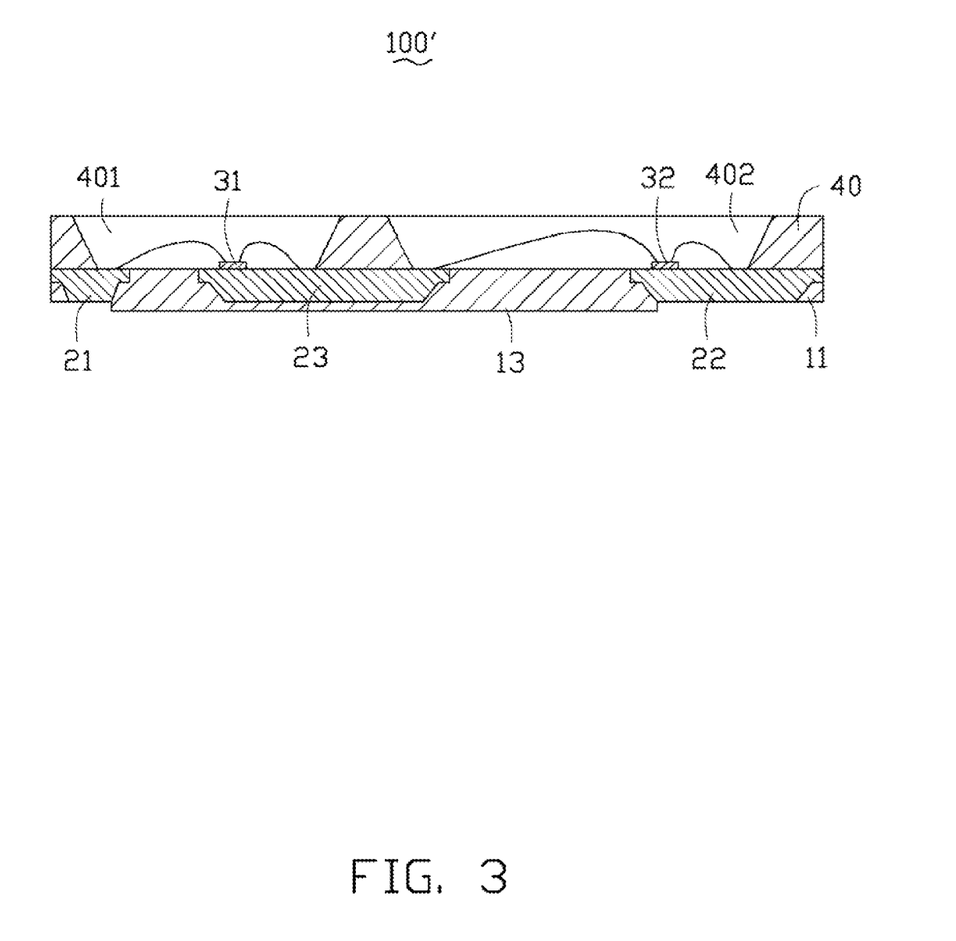
FIG. 3 shows a cross-sectional view of an LED package in accordance with a second exemplary embodiment of the present disclosure.

Referring to FIG. 3, the difference between the second embodiment and the first embodiment is that the second embodiment of FIG. 3 does not have the fourth electrode 24 and connecting bar 50 of the first embodiment shown in FIGS. 1-2.

And in the second embodiment, the first LED chip 31 is located on the top surface of the third electrode 23 exposed at the bottom of the first through hole 401, and electrically connects the first and third electrode 21, 23 via wires 301, 302 respectively. The second LED chip 32 is located on the top surface of the second electrode 22 exposed at the bottom of the second through hole 402, and electrically connects the second and third electrode 22, 23 via wires 301, 302 respectively.

According to the LED package 100, 100', firstly, because the first electrode 21 and the second electrode 22 are widely separated by the substrate 10 and at least a third electrode 23, the welding pads on a printed circuit board corresponding with the exposed bottom surfaces of the first and second electrodes 21, 22 are widely separated, such that the welding solder will not easily communicate with each other, which decreases the risk of overflow of solder pads corresponding to the first and second electrodes 21, 22 to contaminate each other; such contamination may cause the LED package 100 (100') to have a short-circuit. Thus, the reliability and quality of the LED package 100 (100') are improved.

Secondly, because the bottom surface of main portion 11 is located above the bottom surface of the protruding portion 13 of the substrate 10, when mounting the LED package 100, 100' on a printed circuit board, more welding solder can be retained in the receiving spaces 12 to electrically connect the exposed bottom surfaces of the first and second electrodes 21, 22 with the corresponding welding pads of the printed circuit board. It makes the LED package 100, 100' be more firmly mounted on the printed circuit board.

The present disclosure further provides a method for manufacturing the LED package. The method includes following steps.

Figure 4:
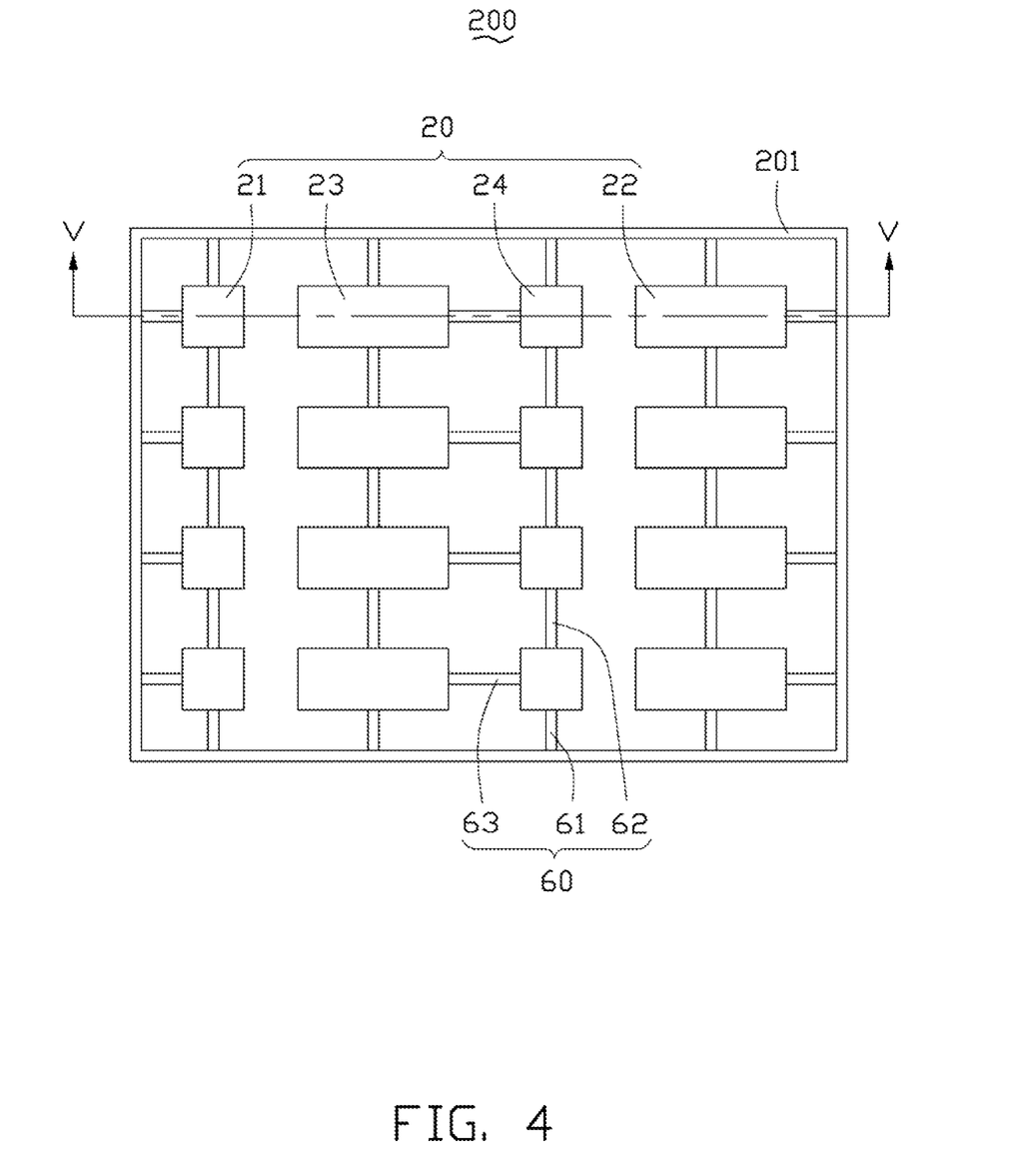
FIGS. 4-11 are schematic views showing steps of a method for manufacturing an LED package of the present disclosure.
Figure 5:
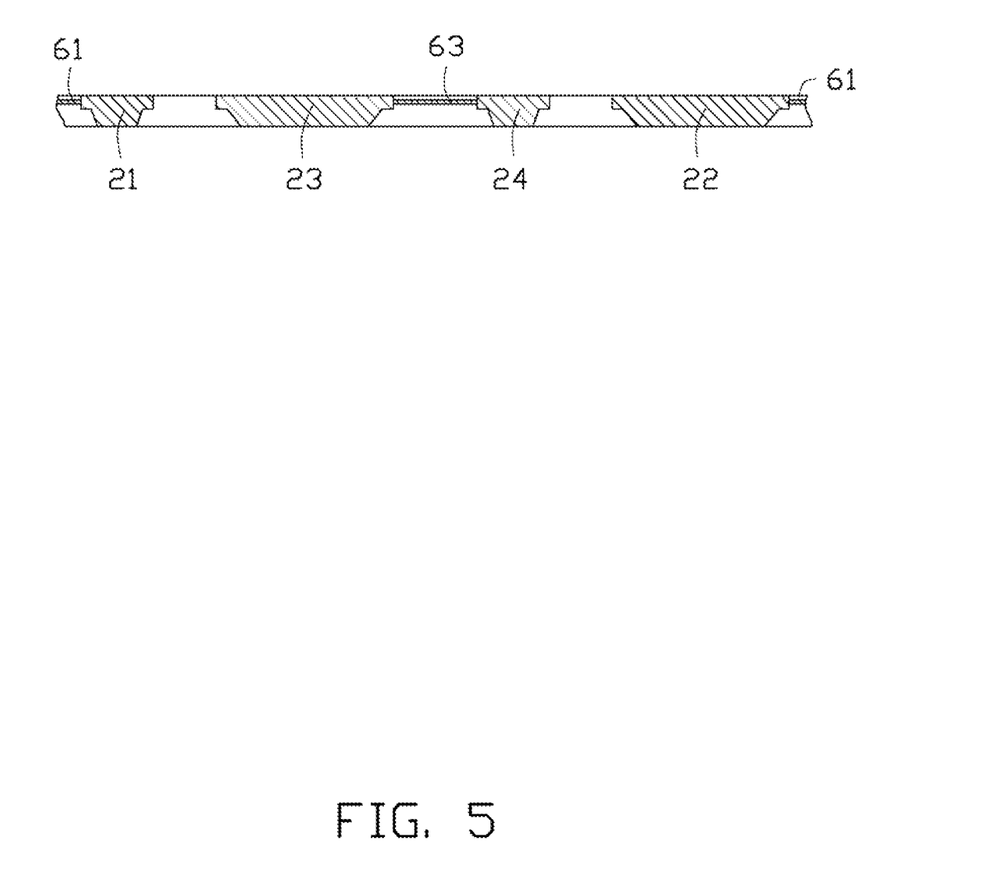

Referring to FIG. 4-5, the first step is providing an engaging frame 200. The engaging frame 200 includes a rectangular lead frame 201, a plurality of electrode structures 20 enclosed by the lead frame 201, and a bracket 60 connecting the electrode structures 20 to the lead frame 201. The lead frame 201 is made of metallic material, such as copper.

In this embodiment, the number of the electrode structures 20 is four. The four electrode structures 20 are arranged in four rows along a top-to-bottom direction of the lead frame 201, as viewed from FIG. 4. Each electrode structure 20 includes first, second, third, and fourth electrodes 21, 22, 23, 24. The first, second, third and fourth electrodes 21, 22, 23, 24 of the electrode structure 20 are spaced from each other, and are arranged along the longitudinal (left to right) direction of the lead frame 201. The third and the fourth electrodes 23, 24 are successively located between the first and second electrode 21, 22. The first, second, third and fourth electrodes 21, 22, 23, 24 have the same thickness.

The bracket 60 includes a plurality of first brackets 61, a plurality of second brackets 62 and a plurality of third brackets 63. The first brackets 61 connect the outer sides of the electrodes 21, 22, 23, 24 facing towards the lead frame 201 to the corresponding inner surfaces of the lead frame 201. Two adjacent first electrodes 21, two adjacent second electrodes 22, two adjacent third electrodes 23 and two adjacent fourth electrodes 24 are respectively connected together by the second brackets 62. The third electrode 23 and the fourth electrode 24 of each electrode structure 20 are connected together by a corresponding third bracket 63.

Figure 6:
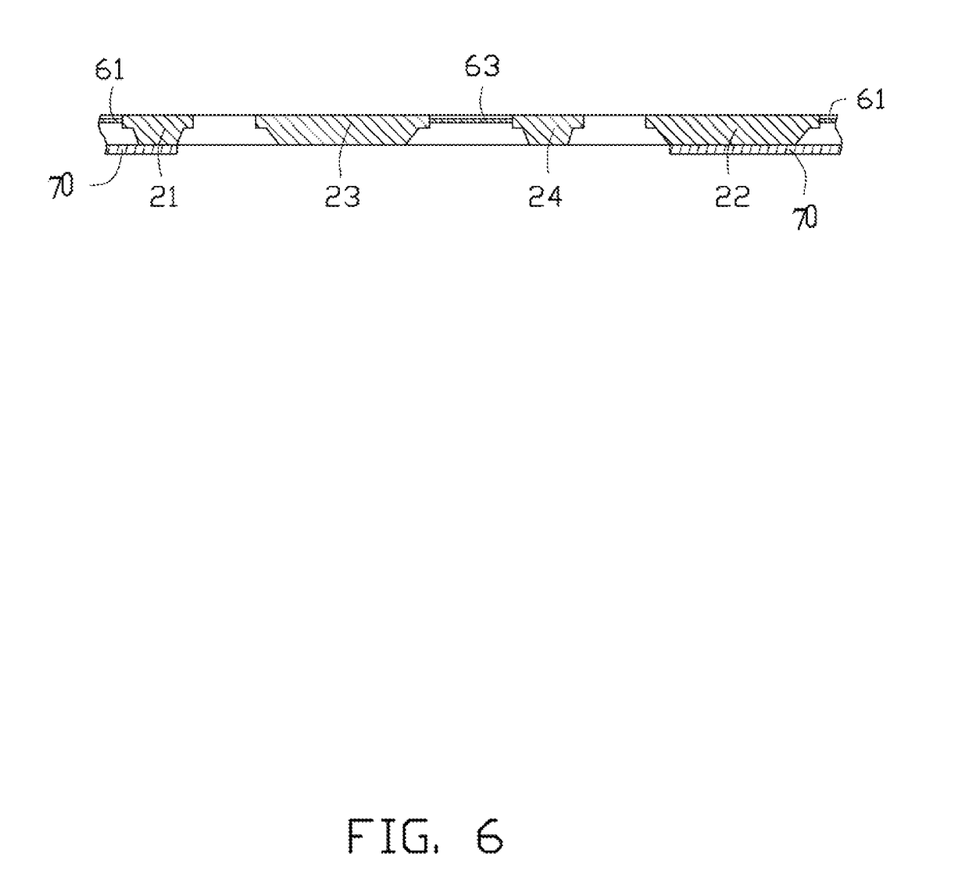

Referring to FIG. 6, the second step is providing a plurality of supporting pads 70, and arranging the supporting pads 70 under the bottom surfaces of the first and second electrodes 21, 22 respectively. In this embodiment, the supporting pads 70 each are a rectangular board, and cover the bottom surfaces of the first and second electrodes 21, 22 respectively. The supporting pad 70 is thinner than the first and second electrodes 21, 22. The supporting pad 70 can be made of TF (trifluoromethanesulfonyl) or Polyamide.

Figure 7:
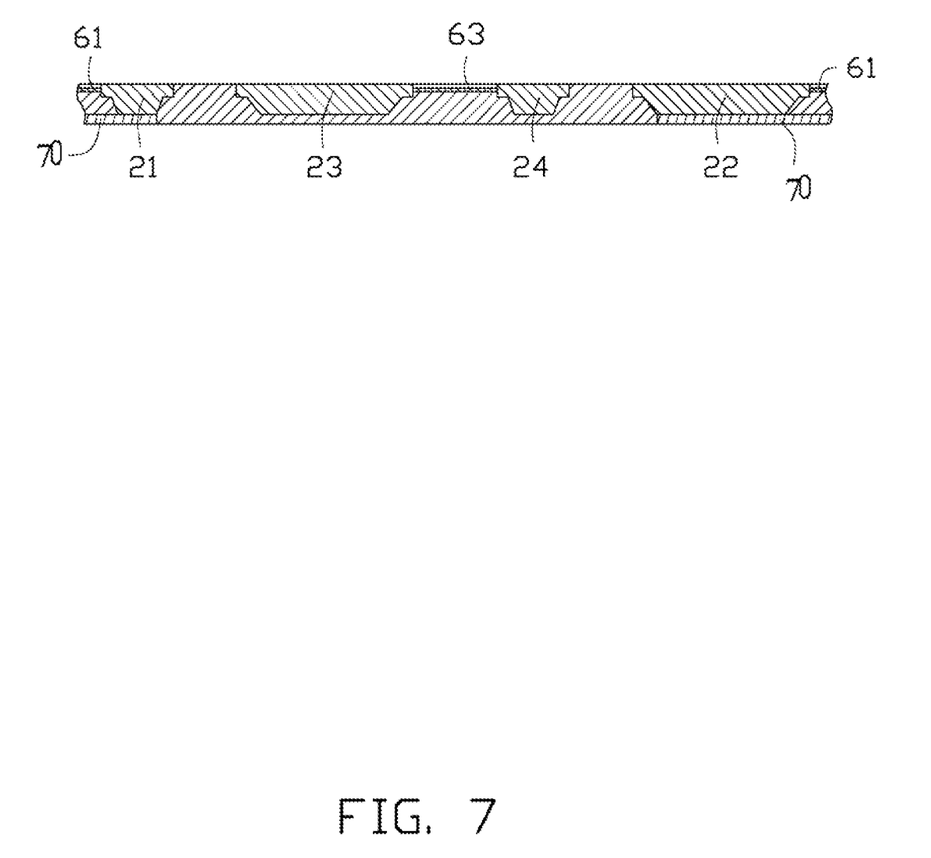

Referring to FIG. 7, the third step is forming a substrate 10 encapsulating the electrode structures 20. In this embodiment, the substrate 10 is formed by molding. The top surfaces of the first, second, third and fourth electrodes 21, 22, 23, 24 are exposed out of the top surface of the substrate 10. Bottom surfaces of the first and second electrodes 21, 22 are exposed out of the bottom surface of the main portion 11. Bottom surfaces of the third and fourth electrode 23, 24 are received in the main portion 11, and are covered by the protruding portion 13.

Figure 8:
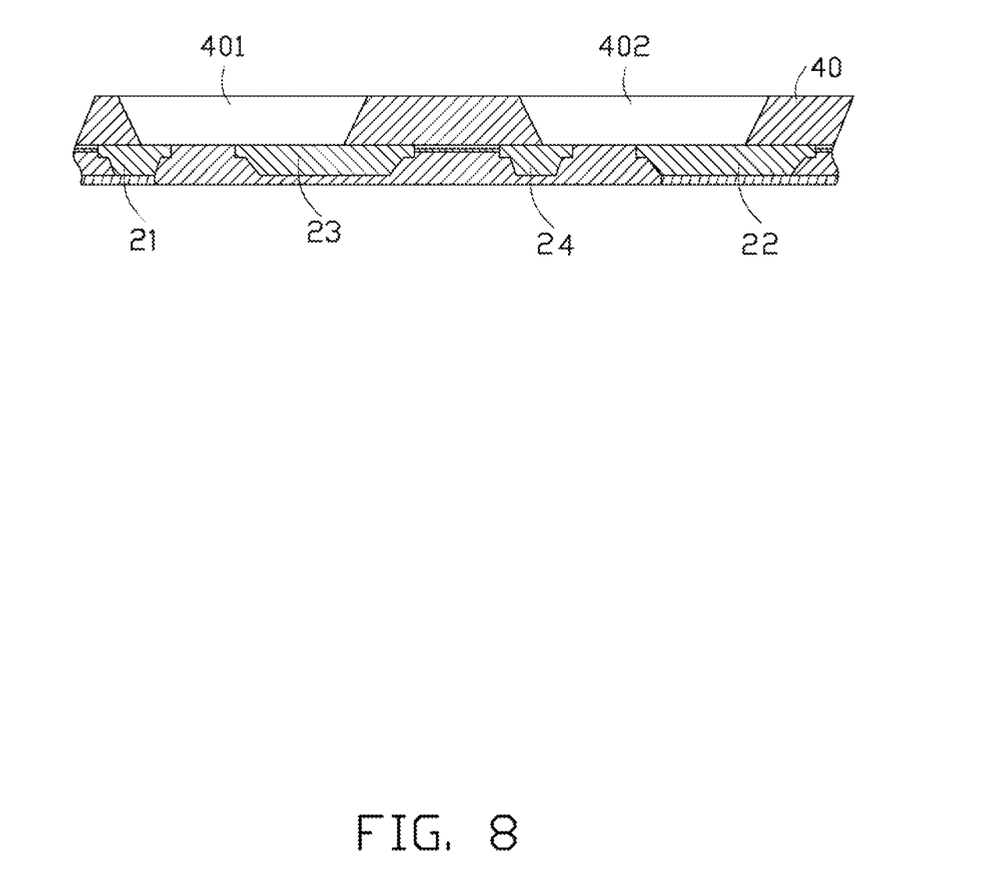

Referring to FIG. 8, the fourth step is forming a reflector 40 on the substrate 10 to cover a part of the electrode structures 20. In this embodiment, each first through hole 401 is corresponding with the first and third electrodes 21, 23. A part of the top surface of the first electrode 21 is exposed at the bottom end of the first through hole 401, and a part of the top surface of the third electrode 23 is exposed at the bottom end of the first through hole 401 as well to support the first LED chip 31.

Similarly, each second through hole 402 is corresponding with the second and fourth electrode 22, 24. A part of the top surface of the second electrode 22 is exposed at the bottom end of the second through hole 402; and a part of the top surface of the fourth electrode 24 is exposed at the bottom end of the second through hole 402 as well to support the second LED chip 32.

Figure 9:
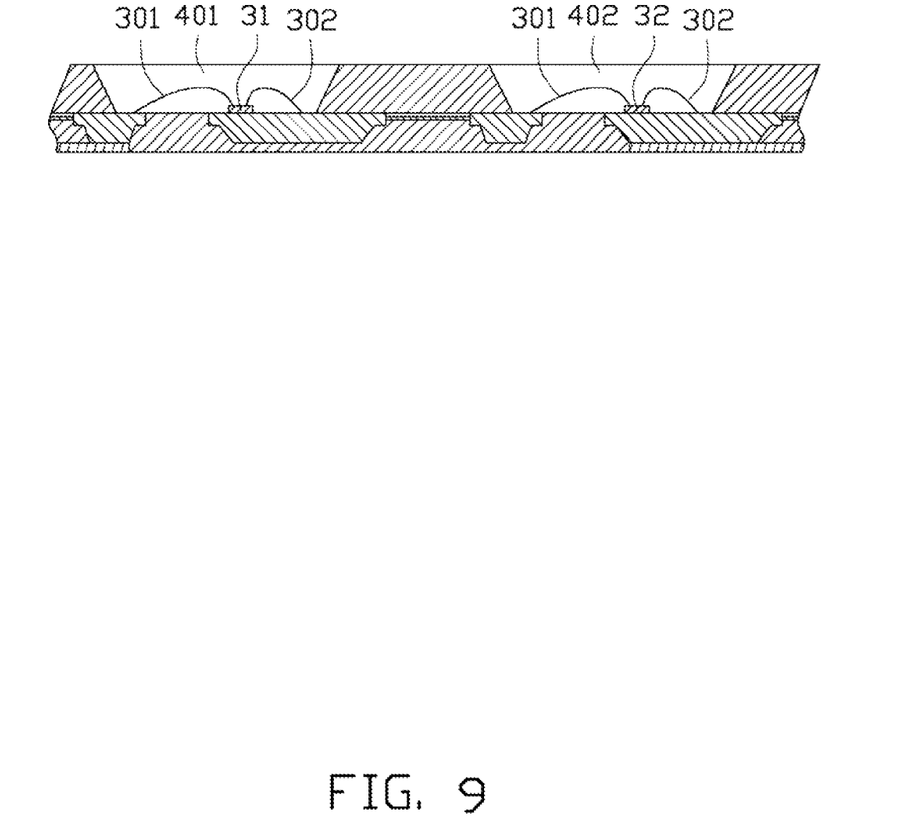

Referring to FIG. 9, the fifth step is providing the first LED chip 31 and the second LED chip 32, and mounting the first and second LED chips 31, 32 at bottoms of the through holes 401, 402 correspondingly to electrically connect the electrodes 21, 22, 23, 24.

Figure 10:
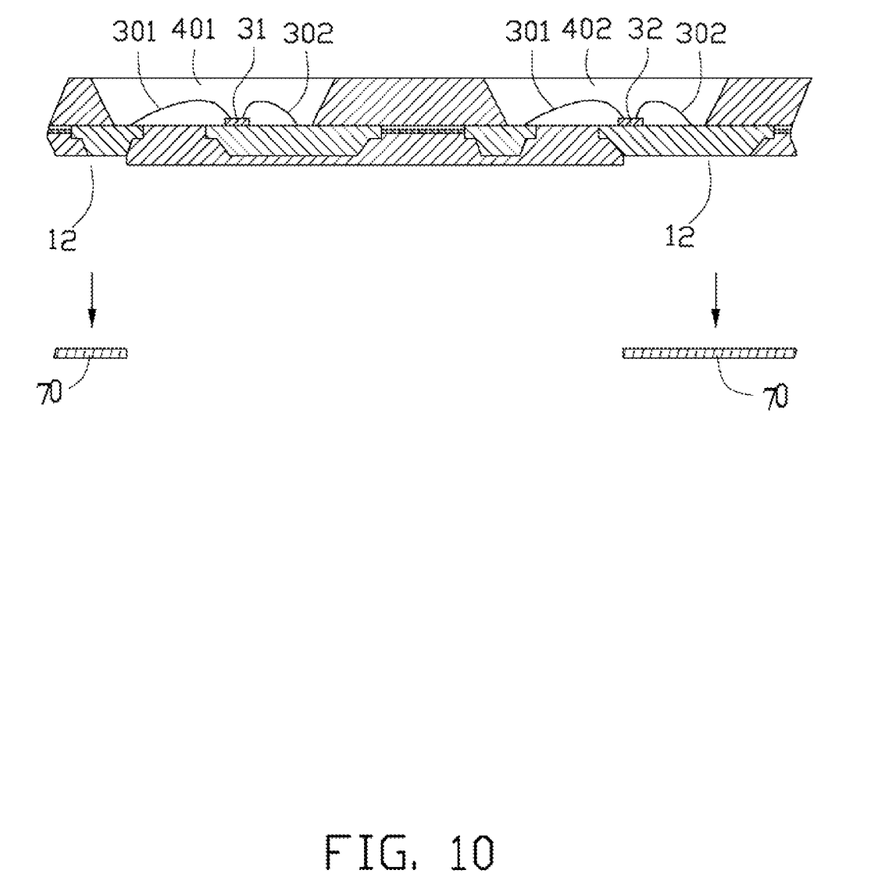

Referring to FIG. 10, the sixth step is separating the supporting pads 70 from the bottom surfaces of the first and second electrodes 21, 22. In this embodiment, after the supporting pads 70 are removed from the bottom surfaces of the first and second electrodes 21, 22, the receiving spaces 12 are defined by the bottom surface of the main portion 11 and the opposite outer end faces of the protruding portion 13.

Figure 11:
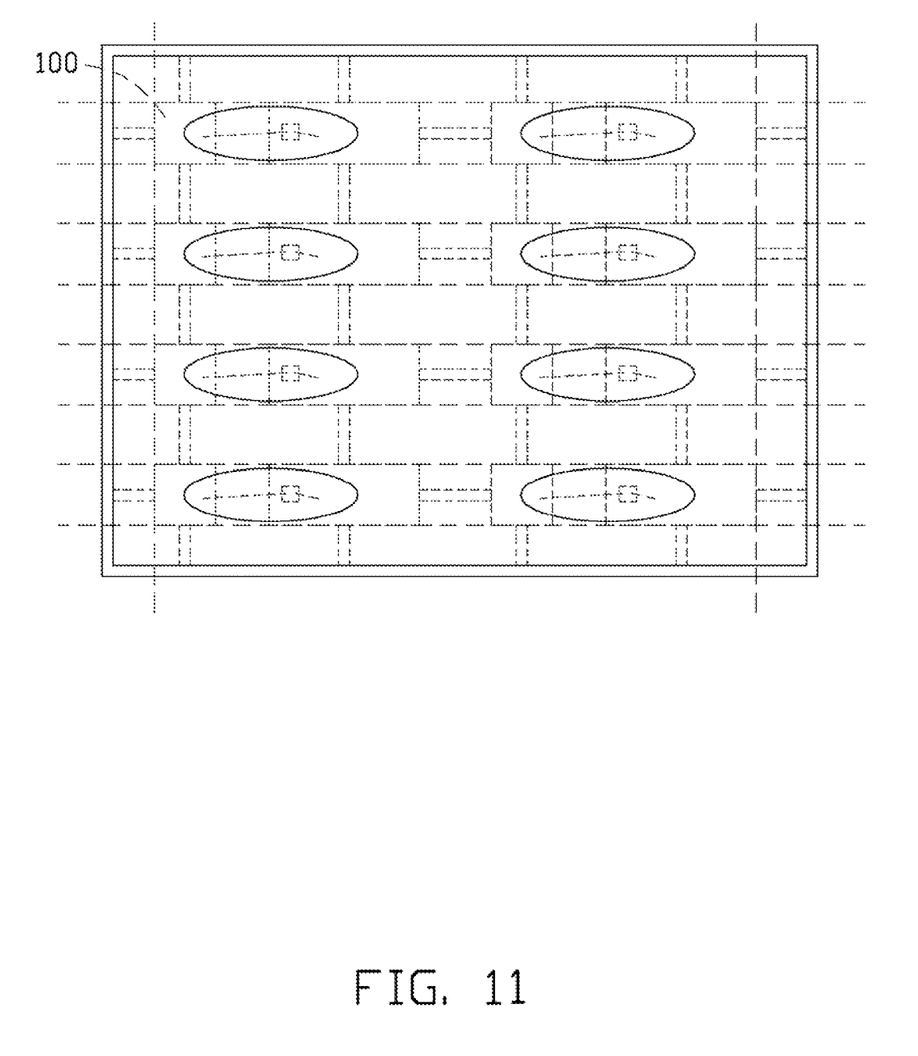

Referring to FIG. 11, the seventh step is cutting the engaging frame 200 and the substrate 10 to obtain a plurality of individual LED packages 100. In this embodiment, cutting the engaging frame 200 and the substrate 10 along the dashed lines shown in FIG. 9 to form the LED packages 100. The dashed lines in FIG. 11 show that each LED package 100 includes one first LED chip 31 and one second LED chip 32. Nevertheless, the dashed lines can be altered so that each LED package 100 can include more than one first LED chip 31 and more than one second LED chip 32.

Alternatively, between the sixth step and the seventh step, phosphor layers can be formed in the through holes 401, 402 respectively to encapsulate the first and second LED chips 31, 32.

It is to be understood that the above-described embodiments are intended to illustrate rather than limit the disclosure. Variations may be made to the embodiments without departing from the spirit of the disclosure as claimed. The above-described embodiments illustrate the scope of the disclosure but do not restrict the scope of the disclosure.

What is claimed is:

1. A light emitting diode (LED) package comprising:
   an electrically insulating substrate, the substrate comprising a main portion and a protruding portion extending downwardly from a bottom surface of the main portion, the main portion being located above the protruding portion;
   an electrode structure embedded in the main portion of the substrate, the electrode structure comprising a first electrode, a second electrode and a third electrode spaced from each other; and
   a plurality of LED chips electrically connecting with the first, second and third electrodes respectively, the first and second electrodes being located at opposite end of the main portion, top surfaces and bottom surfaces of the first and second electrodes being exposed out of the main portion respectively, the third electrode being located between the first and second electrodes, a top surface of the third electrode being exposed out of the top surface of the main portion, and a bottom surface of the third electrode being covered by the protruding portion.

2. The LED package of claim 1, wherein the main portion and the protruding portion are rectangular parallelepiped and the protruding portion is thinner than the main portion.

3. The LED package of claim 2, wherein the protruding portion extends from a central portion of the bottom surface of the main portion, such that a front side view of the substrate represent "T" shape.

4. The LED package of claim 3, wherein the bottom surface of the substrate is located above the bottom surface of the protruding portion, and two receiving spaces are defined by the bottom surface of the main portion and opposite lateral end faces of the protruding portion respectively.

5. The LED package of claim 1, wherein top surfaces of the first, second and third electrodes are coplanar with each other, and are coplanar with the top surface of the main portion of the substrate.

6. The LED package of claim 5, wherein bottom surfaces of the first and second electrodes are coplanar with the bottom surface of the main portion.

7. The LED package of claim 1, wherein the LED chips comprise a first LED chip and a second LED chip, the first LED chip is located on the top surface of the third electrode, and electrically connects with the first and third electrodes, the second LED chip is located on the top surface of the second LED chip, and electrically connects the second and third electrodes respectively.

8. The LED package of claim 7, wherein a reflector is located on the substrate, the reflector defines a first through hole and a second through hole therein, the first LED chip is located at the bottom of the first through hole, and the second LED chip is located at the bottom of the second through hole.

9. The LED package of claim 1, wherein the electrode structure further comprises a fourth electrode embedded in the main portion of the substrate, and the fourth electrode is located between the third and the second electrodes, the fourth electrode connects the third electrode via a connecting bar.

10. The LED package of claim 9, wherein a top surface of the fourth electrode is exposed out of the main portion of the substrate, a bottom surface of the fourth electrode is covered by the protruding portion.

11. The LED package of claim 10, wherein the LED chips comprise a first LED chip and a second LED chip, the first LED chip is located on the top surface of the third electrode, and electrically connects with the first and third electrodes respectively, the second LED chip is located on the top surface of the second LED chip, and electrically connects with the second and fourth electrodes respectively.

12. A method for manufacturing a light emitting diode (LED) package comprising:
   S1: providing an engaging frame, the engaging frame comprising a plurality of electrode structures arranged in rows along a height direction of the engaging frame, each electrode structure comprising a first electrode, a second electrode and a third electrode arranged along a width direction of the engaging frame, the electrodes being spaced from each other, and the third electrode being located between the first and second electrodes;
   S2: providing a plurality of supporting pads, and arranging the supporting pads under the bottom surfaces of the first and second electrodes respectively;
   S3: forming a substrate to encapsulate the electrode structures therein, the substrate comprising a main portion and a protruding portion extending from a bottom surface of the main portion, the main portion being located above the protruding portion, top surfaces of the first, second and third electrodes being exposed out of the top surface of the main portion, bottom surfaces of the first and second electrodes being exposed out of bottom surface of the main portion, a bottom surface of the third electrode being covered by the protruding portion;
   S4: providing a first LED chip and a second LED chip, and making the first LED chip electrically connected with the first and third electrodes, the second LED chip electrically connected with the second and third electrodes;
   S5: separating the supporting pads from the bottom surfaces of the first and second electrodes;
   S6: cutting the engaging frame and the substrate to obtain a plurality of individual LED packages each including at least one first LED chip and at least one second LED chip.

13. The method of claim 12, further comprising a step between the step S3 and S4, and the step is performed by forming a reflector on the substrate, the reflector defining a first through hole and a second through hole therein, parts of top surfaces of the first and third electrodes are exposed at the bottom of the first through hole, and parts of the top surfaces of the second and third electrodes are exposed at the bottom of the second through hole.

14. The method of claim 13, wherein the first LED chip is mounted on the top surface of the third electrode exposed at the bottom of the first through hole, the second LED chip is mounted on the top surface of the second electrode exposed at the bottom of the second through hole.

15. The method of claim 12, wherein the engaging frame further comprises a rectangular lead frame and a plurality of connecting brackets connecting the electrode structures to the lead frame.

* * * * *